(12) United States Patent
Sun et al.

(10) Patent No.: US 8,307,255 B2
(45) Date of Patent: Nov. 6, 2012

(54) SCALABLE DECODER ARCHITECTURE FOR LOW DENSITY PARITY CHECK CODES

(75) Inventors: Yang Sun, Houston, TX (US); Yuming Zhu, Plano, TX (US); Manish Goel, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 439 days.

(21) Appl. No.: 12/616,925

(22) Filed: Nov. 12, 2009

(65) Prior Publication Data

US 2010/0122142 A1    May 13, 2010

Related U.S. Application Data

(60) Provisional application No. 61/113,926, filed on Nov. 12, 2008, provisional application No. 61/114,790, filed on Nov. 14, 2008.

(51) Int. Cl.
 G06F 11/00        (2006.01)
(52) U.S. Cl. .................................. 714/758; 714/801
(58) Field of Classification Search ................ 714/758, 714/801
See application file for complete search history.

(56) References Cited

U.S. PATENT DOCUMENTS

| | | | |
|---|---|---|---|
| 7,139,959 B2 | 11/2006 | Hocevar | |
| 7,178,080 B2 | 2/2007 | Hocevar | |
| 7,181,676 B2 | 2/2007 | Hocevar | |
| 7,500,172 B2 | 3/2009 | Shen et al. | |
| 7,757,149 B2* | 7/2010 | Xin et al. | 714/752 |
| 2003/0229843 A1* | 12/2003 | Yu et al. | 714/794 |
| 2004/0034828 A1* | 2/2004 | Hocevar | 714/800 |
| 2004/0194007 A1* | 9/2004 | Hocevar | 714/801 |
| 2005/0166132 A1* | 7/2005 | Shen et al. | 714/801 |
| 2005/0289438 A1* | 12/2005 | Massey | 714/758 |
| 2006/0123318 A1* | 6/2006 | Kim et al. | 714/758 |
| 2007/0283215 A1 | 12/2007 | Zhu et al. | |
| 2010/0115386 A1* | 5/2010 | Zhu et al. | 714/801 |
| 2010/0318872 A1* | 12/2010 | Wang | 714/752 |

FOREIGN PATENT DOCUMENTS

WO    2009053940 A2    4/2009

OTHER PUBLICATIONS

Chih-Hao Liu et al.; IEEE Journal of Solid-State Circuits, vol. 43, No. 3, Mar. 2008, pp. 684-694.

* cited by examiner

*Primary Examiner* — Scott Baderman
*Assistant Examiner* — Elmira Mehrmanesh
(74) *Attorney, Agent, or Firm* — Steven A. Shaw; W. James Brady; Frederick J. Telecky, Jr.

(57) ABSTRACT

A layered message updating method and system for the decoding of LDPC codes with high sub-matrix degree has a scalable and flexible decoder architecture to support LDPC codes with arbitrary high sub-matrix degree with very small hardware overhead and high throughput. Embodiments of the invention support LDPC codes with sub-matrix degree $W>=1$. The architecture does not require duplication of extrinsic memory which greatly reduces decoder complexity. The size of the memory is also independent of sub-matrix degree which makes the decoder scalable for large W values.

11 Claims, 5 Drawing Sheets

SCALABLE DECODER ARCHITECTURE FOR LOW DENSITY PARITY CHECK CODES

CROSS-REFERENCE TO RELATED APPLICATIONS

This application claims priority, under 35 U.S.C. §119(e), to Provisional Application Nos. 61/113,926, filed Nov. 12, 2008 and 61/114,790, filed Nov. 14, 2008. This application is related to U.S. application Ser. No. 11/463,236, filed on Aug. 8, 2006, entitled A HARDWARE-EFFICIENT LOW DENSITY PARITY CHECK CODE FOR DIGITAL COMMUNICATIONS; which is a Continuation of U.S. application Ser. No. 10/329,597, filed on Dec. 26, 2002—now U.S. Pat. No. 7,178,080. This application is also related to U.S. application Ser. No. 11/744,357, filed on May 4, 2007, entitled PARITY CHECK DECODER ARCHITECTURE. All said applications incorporated herein by reference.

STATEMENT REGARDING FEDERALLY SPONSORED RESEARCH OR DEVELOPMENT

Not applicable.

BACKGROUND

Embodiments of the invention are in the field of digital data communications, and is more specifically directed to Low-Density Parity-Check (LDPC) codes and a scalable decoder architecture.

A problem common to digital data communication technology is the likelihood of data corruption. Data is usually corrupted by noise occurring in the communication channel. The noise interferes with the signal carrying the data over the channel, causing errors in the data bits, or symbols. As is fundamental in the art, the signal-to-noise ratio for a communications channel is a degree of goodness of the communications carried out over that channel, as it conveys the relative strength of the signal that carries the data (as attenuated over distance and time), to the noise present on that channel. These factors relate directly to the likelihood that a data bit or symbol received over the channel will be in error relative to the data bit or symbol as transmitted. This likelihood is reflected by the error probability for the communications over the channel, commonly expressed as the Bit Error Rate (BER) ratio of errored bits to total bits transmitted. In short, the likelihood of error in data communications must be considered in developing a communications technology. Techniques for detecting and correcting errors in the communicated data must be incorporated for the communications technology to be useful.

Various techniques for detecting and correcting errors in the bits have been developed. At least some error detection and correction techniques are implemented through redundant coding of the bits. For example, parity bits may be inserted into the transmitted data stream sent over the communication channel. These parity bits do not add any additional information, but can be cross-referenced to detect and correct errors in the values of other bits. Of course, these parity bits are also prone to errors. As another example, a code may repeat the transmission; for instance, the payload is sent three times. The receiver deduces the payload by using a decoder to determine which bit in each position was received two or more times. The drawback of such a decoder is that if a bit is received erroneously two or more times, the decoder will select the erroneous bit as correct. There is tradeoff between decoder architecture complexity and bit error rate. A desire for a lower bit error rate typically results in higher complexity decoder architecture than would be the case if a higher bit error rate was permitted. An architecture, system, or method that results in a less complex decoder while maintaining a low the bit error rate is desirable.

Error detection and correction techniques are typically implemented through the use of redundant coding of the data. In general, redundant coding inserts data bits into the transmitted data stream that do not add any additional information, but that indicate whether an error is present in the received data stream. More complex codes provide the ability to deduce the true transmitted data from a received data stream, despite the presence of errors.

Many types of redundant codes that provide error correction have been developed. One type of code simply repeats the transmission, for example repeating the payload twice, so that the receiver deduces the transmitted data by applying a decoder that determines the majority vote of the three transmissions for each bit. Of course, this simple redundant approach does not necessarily correct every error, but greatly reduces the payload data rate. In this example, a predictable likelihood remains that two of three bits are in error, resulting in an erroneous majority vote despite the useful data rate having been reduced to one-third. More efficient approaches, such as Hamming codes, have been developed toward the goal of reducing the error rate while maximizing the data rate.

Another class of known redundant codes is the Low Density Parity Check code. Low-Density Parity-Check (LDPC) codes are linear block codes with sparse parity check matrices. Their asymptotic performance can be as close to one tenth dB away from the Shannon limit. Another advantage of LDPC codes is that the decoding algorithm is inherently parallel and so a wide variety of hardware implementations can be derived that exploit this feature. Because of their extraordinary performance, LDPC codes have been adopted in many recent communication standards such as DVB-S2, 10GBase-T, 802.16 and 802.11n, etc. LDPC codes are also serious candidates for many storage applications.

Existing LDPC decoders can only handle sub-matrix degree W=1 with reasonable complexity. If W is larger than 1, then the decoding complexity dramatically increases. Thus it limited many high performance LDPC codes from being implemented in real systems. A general decoder architecture that can handle LDPC codes with higher sub-matrix degree is still missing and needs to be developed for future applications on LDPC codes. There is a need for an algorithm and scalable decoder architecture to handle W>=1 case.

BRIEF DESCRIPTION OF THE SEVERAL VIEWS OF THE DRAWING

Figure 1:
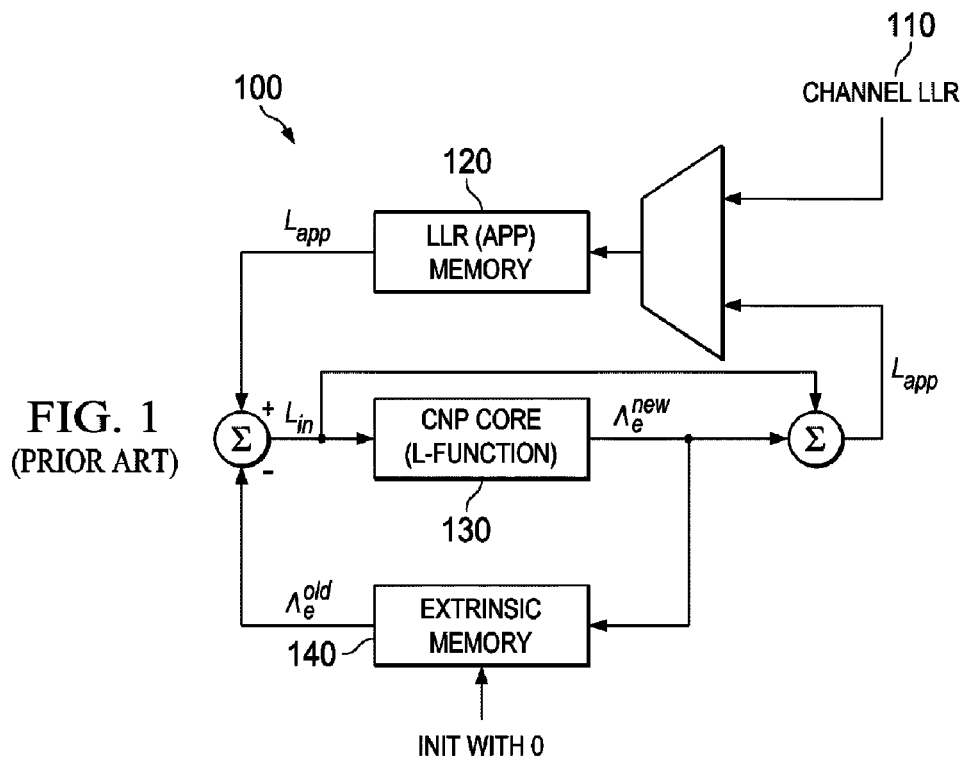

Having thus described the invention in general terms, reference will now be made to the accompanying drawings, which are not necessarily drawn to scale, and wherein:

FIG. 1 shows an iterative LDPC decoder structure.

Figure 2:
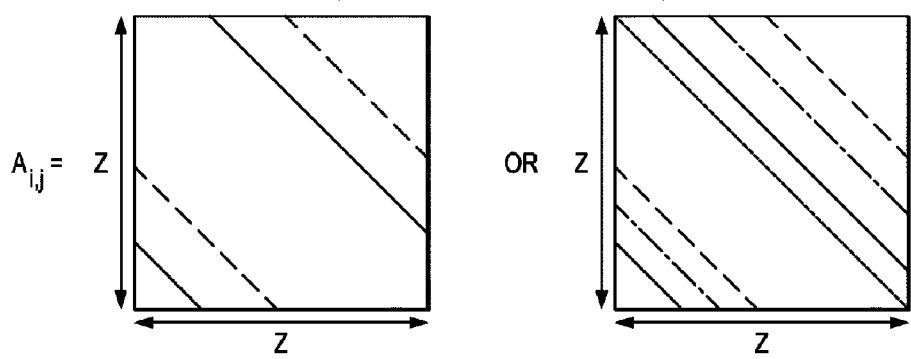

FIG. 2 shows an example of LDPC code.

Figure 3:
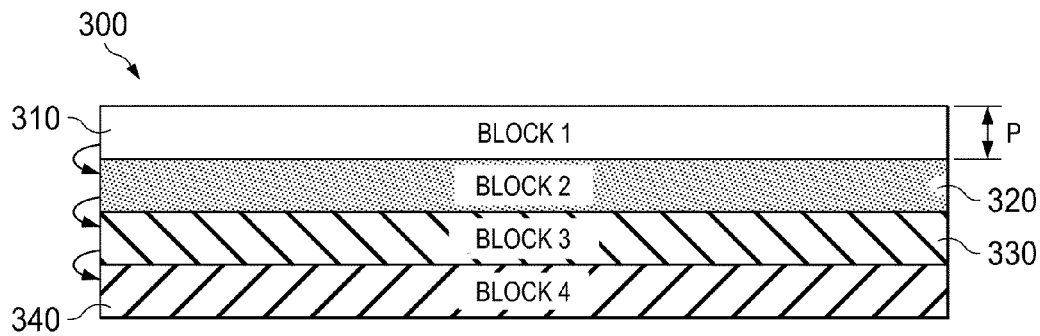

FIG. 3 shows row based implementation.

Figure 4:
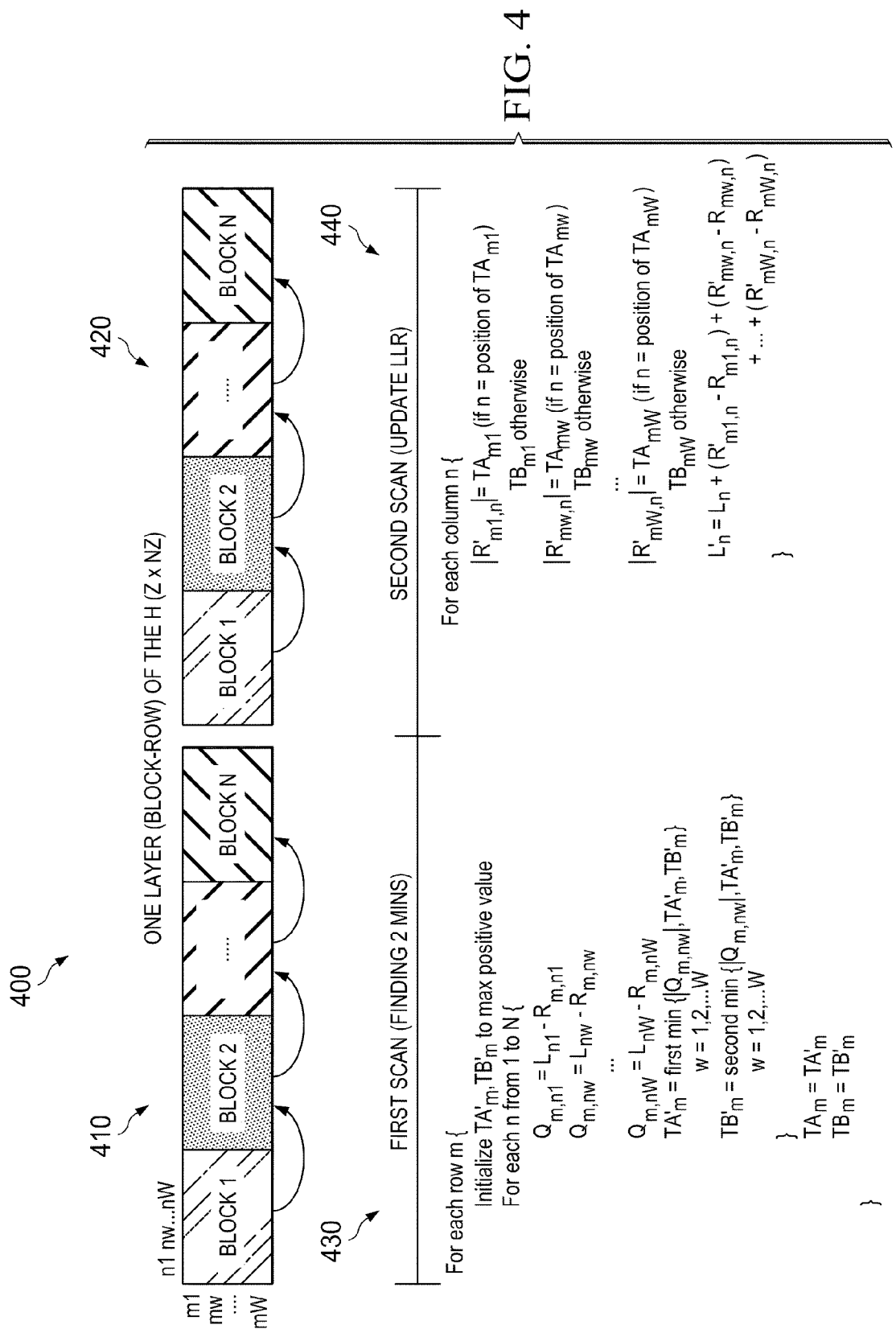

FIG. 4 is illustrative of a double scan decoding algorithm.

Figure 5:
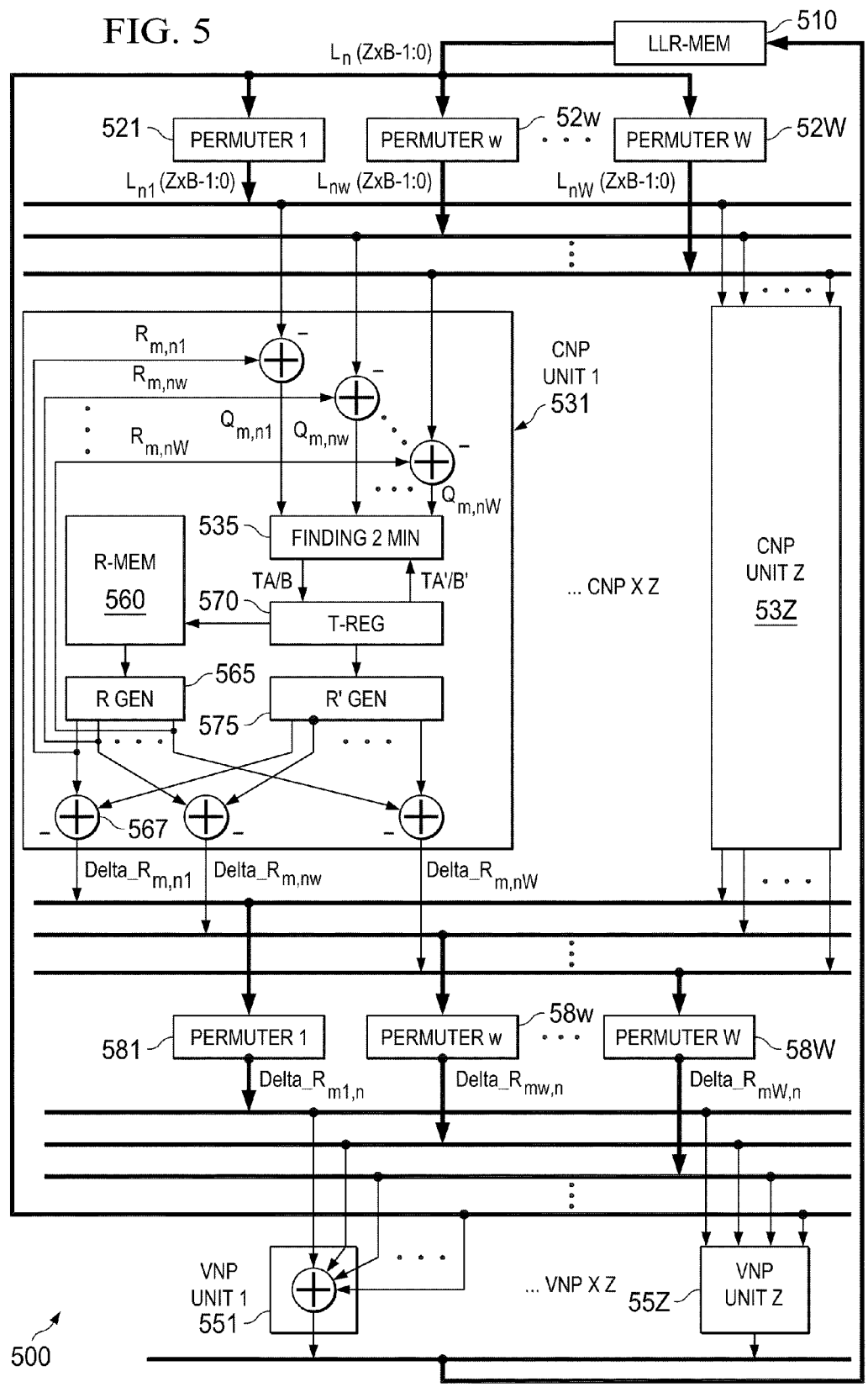

FIG. 5 is block diagram illustrative of a column based LDPC decoder architecture in accordance with an embodiment of the invention.

Figure 6:
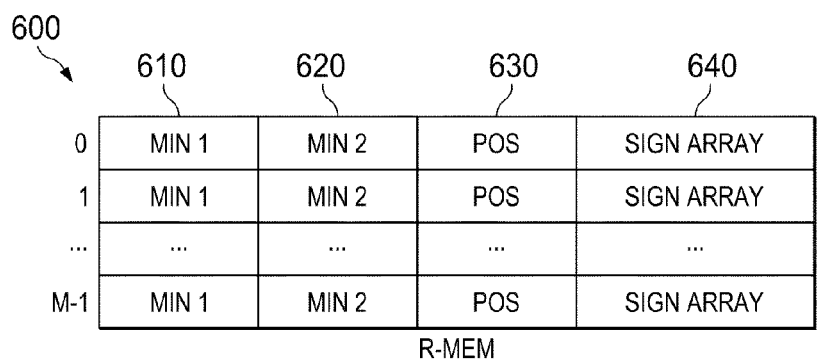

FIG. 6 shows R-Mem organization

Figure 7:
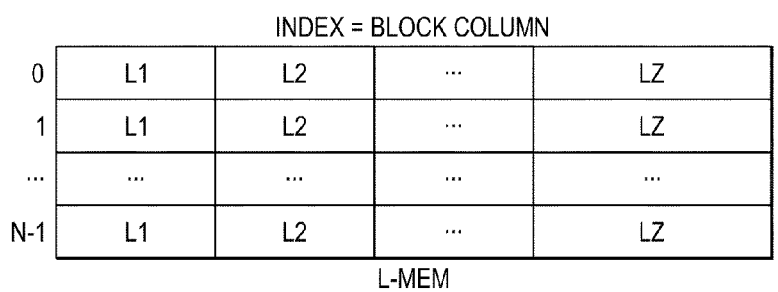

FIG. 7 shows L-Mem organization

Figure 8:
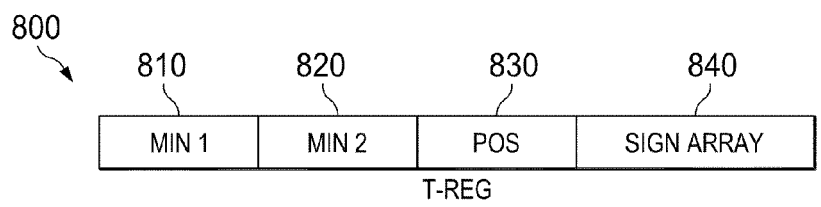

FIG. 8 shows T-Reg Organization

Figure 9:
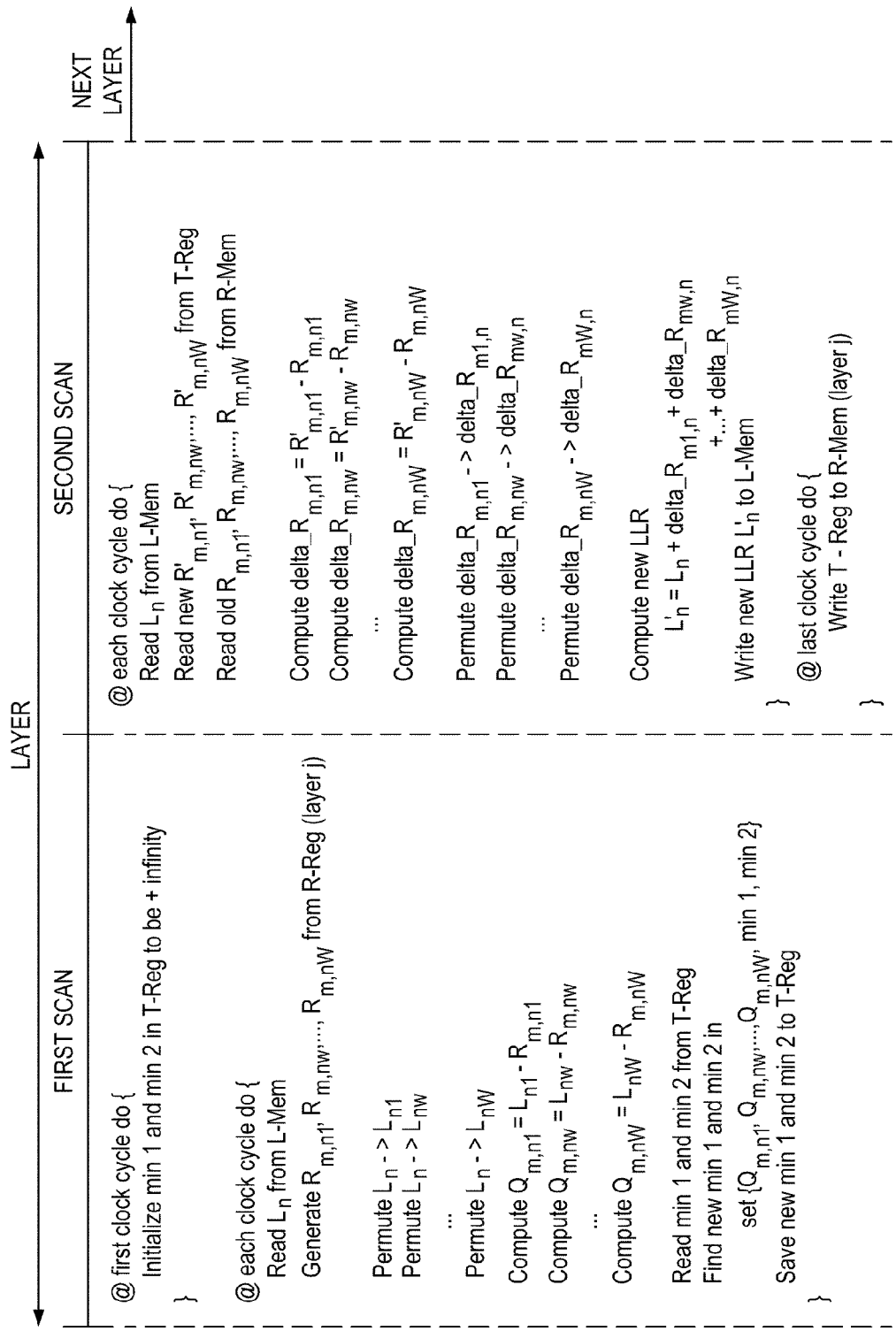

FIG. 9 shows cycle-by-cycle scheduling operation for one block row

DETAILED DESCRIPTION OF THE INVENTION

It should be understood at the outset that although several illustrative embodiments are described below, the present disclosure may be implemented using any number of techniques whether currently known or later developed. The present disclosure should in no way be limited to the illustrative embodiments described and illustrated herein, and may be modified within the scope of the appended claims along with their full scope of equivalents.

Certain terms are used throughout the following claims and discussion to refer to particular system components. This document does not intend to distinguish between components that differ in name but not function. In the following discussion and in the claims, the terms "including" and "comprising" are used in an open-ended fashion, and thus should be interpreted to mean "including but not limited to". Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more hardware components, and may be used to refer to an electronic device or circuit, or a portion of an electronic device or circuit.

Embodiments of the invention will be described in connection with an example of its implementation in an exemplary transceiver, for example a wireless network adapter such as according to the National Aeronautics and Space Administration (NASA) Goddard Space Flight Center (GSFC) standard. It will be apparent to those skilled in the art having reference to this specification that this invention is particularly well-suited for use in such an application. However, it is also contemplated that this invention will be of similar benefit in many other applications that involve error correction coding, including communications according to orthogonal frequency division multiplexing (OFDM), discrete multitone modulation (DMT) for example as used in conventional Digital Subscriber Line (DSL) modems, and other modulation and communication approaches, whether carried out as land line or wireless communications. It is therefore to be understood that these and other alternatives to and variations on the embodiment described below are contemplated to be within the scope of the invention as claimed.

A low-density parity-check ("LDPC") code is a type of redundant code that enables accurate detection and correction of the bits of signals sent over a communication channel. The "parity-check" adjectives refer to verifying the transmission using a matrix H, which defines the code, in conjunction with the parity bits to detect and correct errors. The "low-density" adjectives refer to the sparsity of H. Any sparse matrix, including H, has zero for the value of the majority of its elements.

The matrix H is designed such that a zero matrix results when H is multiplied by t, as described by the equation $$Ht=0,$$

wherein t is a non-erroneous, or valid, set of bits. Hence, whenever $Ht \neq 0$, it is known that t contains erroneous bits. Each set t consists of the source message, s, combined with the corresponding parity-check bits for that particular s. When a set t is transmitted, the receiving network element receives a vector r, which is equal to t plus n, as described by the equation $$r=t+n,$$

wherein n is the noise added by the channel. Because an LDPC decoder at the receiver designed to recognize the coding scheme, and hence matrix H, it can compute a vector z=Hr. Because r=t+n, and because Ht=0, the vector z is computed using the equation $$z=Hr=Ht+Hn=Hn.$$

The decoding process thus involves finding the sparsest vector x that satisfies the equation:

$$Hx=z.$$

The vector x becomes the best guess or predictor for noise vector n, which can be subtracted from the received signal vector r to recover set t, thus detecting and correcting errors in the transmitted signal t.

The decoding process involves the iterative manipulation of the signal vector expressed as fractional values in several bits. In at least some preferred embodiments, parity check matrix H is arranged into a composite of circularly shifted identity matrices. This composite is represented by a macro matrix $H_m$, with a 1 value symbolizing a ZxZ circularly shifted identity matrix and a 0 value symbolize a ZxZ zero matrix.

FIG. 1 shows an iterative LDPC Decoder Structure. The structure 100 comprising a channel for LLR (log-likelihood-ratio) input 110. LLR memory 120 for storing APP (a posteriori probability) messages. CNP (check node processor) core 130 for L-function. Extrinsic memory 140 which may be initialized to 0.

LDPC codes used in practical systems are composite of ZxZ zero sub-matrices and non-zero sub-matrices each of which being superimpose of one or more (W) permuted identity matrices of dimension ZxZ. W is referred as the degree of the sub-matrix. For example, FIG. 2 shows an example of LDPC code where the dimension of each sub-matrix is Z and degree W=2 or 4, as an example only. The permutation of the identity matrix shown here is a simple circulant shift, but the actual permutation could be arbitrary.

FIG. 3 shows row based implementation showing 4 blocks 310, 320, 330, 340. In this example, each block is comprised of P rows. The rows are processed in parallel. Each row is processed in 2 or 4 clock cycles.

Decoder Architecture and Operation Description

A column based LDPC decoder architecture is shown in FIG. 5. Computation takes place in variable node processors VNP units 551 . . . 550Z and check node processor CNP units 531 . . . 53Z. There are Z instances of these VNP and CNP units. 531 is detail example of a CNP unit. VNP is used to do the LLR update while CNP takes care of all the rest computations.

In this architecture, there are three types of storage:
- LLR memory (L-Mem) 510 is used for storing initial and updated LLR values for each bit in codeword. For LDPC codes with MxN sub-matrices and each sub-matrix of dimension ZxZ, the memory 510 is organized such that Z LLR values are stored in the same memory word and there are N words in the memory.
- R-Mem 560 is used to store the information for restoring the $R_{m,n}$ values. For each row m, the first minimum, the second minimum, the position of the first minimum and the sign bits for all Q values related to row m are stored. Each block row corresponds to one memory word.
- T-Reg 570 is used to store the information for restoring the $R'_{m,n}$ values. The same organization as R-Mem 560 is used. After updating $L'_n$, the T-Reg 570 contents is stored in R-Mem 560 overwriting the values for current block row.

R-Gen 565 generates R values using information stored in R-Mem. R'-Gen 575 generates R' values using information from T-Reg 570. The number of Adders 567 are determined by the throughput.

The organization of R-Mem is shown in FIG. 6. Organization 600 includes storage of $RA_m$ min1 610, and $RB_m$ min2 620, storage of pos 630 and sign array 640.

The organization of L-Mem 510 is shown in FIG. 7.

The organization of T-Reg 570 is shown in FIG. 8. Organization 800 includes storage of $TA_m$ min1 810, and $TB_m$ min2 820, storage of pos 830 and sign array 840.

Permuters 521, 52w, ..., 52W and 581, 58w, ..., 58W are used to perform the permutation of each sub-matrix back and forth. The number of permuters used in the architecture can be determined by the throughput requirement. For example only, 2 permuters are used to handle the two stream for W=2 case. Permuters 58w (w=1 to W) may time shared for handling $R_{m,n}$ and $R'_{m,n}$ values. We may also use only 1 permuter and time shared for two streams as well as the $R_{m,n}$ and $R'_{m,n}$ values with smaller area and larger cycle count. We may also use permuters with no time sharing.

I. Double Scan Decoding Algorithm

FIG. 4 is illustrative of a double scan decoding algorithm. Embodiments of the invention provide double scan decoding based on soft-decision Min-Sum algorithm. Each parity check row is processed twice in serial. P number of check rows are processed in parallel; here P is equal to Z. The soft information input the decoder is the log-likelihood ratio (LLR) of each bits defined by L-function of $$L_n = \log\left(\frac{Prob(\text{bit } n = 0)}{Prob(\text{bit } n = 1)}\right).$$

The decoder iteratively updates the belief information of each bit based on the extrinsic information passing along the decoding. After certain number of iterations or specific stopping criteria are met, the decoder will output the belief information in forms of soft information or hard decision.

A. Initialization:

The belief information of each bit (corresponding to a column in H matrix) $L_n$ is initialized with LLR value input (intrinsic information). The extrinsic information ($R_{m,n}$) from check node m (corresponding to a row in H matrix) to a bit n is initialized with 0.

B. Iterative Update:

FIG. 4 shows one layer (block-row) of the matrix H 400. We will take W=2 in the following description as an exemplar in the following textual description. The iteration is performed in block row order. For each row m in a block row M, the sub-matrixes in the block row are scanned through twice 410, 420. Each sub-matrix will have W positions (n1 and n2 for W=2) with a '1' in the H matrix. FIG. 4 shows the generic case where there may be w positions wherein w can be from 1 to W.

First Scan (Finding Minimum Two) 430

Before the first interation, R-Mem values are initialized to 0; thus, R-Gen 575 is initialized to 0 also. Before the first scan 430, Two temp variables $TA'_m$ and $TB'_m$ for holding minimum ($TA_m$) and second minimum ($TB_m$) are initialized to maximum possible positive value. These values are held in T-Reg 535. The maximum possible value may be the maximum value for the chosen precision in implementation. For each of the N sub-matrixes in the block row, n1 and n2 is obtained (for the exemplar case of W=2).

$R_{m,n1}$ and $R_{m,n2}$ values are generated by R Gen 565 based on the $RA_m$ (min1 610), $RB_m$ (min2 620), $P_m$ (pos 630) and sign array 640 read from R-Mem.

$$|R_{m,n1}| = \begin{cases} RA_m & \text{if } n1 = P_m \\ RB_m & \text{otherwise} \end{cases}$$

$$|R_{m,n2}| = \begin{cases} RA_m & \text{if } n2 = P_m \\ RB_m & \text{otherwise} \end{cases}$$

Sign bits of the $R_{m,n1}$ and $R_{m,n2}$ values are taken from sign array 640 of FIG. 6.

The extrinsic information from bit n1 and n2 to check m are calculated as:

$$Q_{m,n1} = L_{n1} - R_{m,n1}$$

$$Q_{m,n2} = L_{n2} - R_{m,n2}$$

The $|Q_{m,n1}|$ and $|Q_{m,n2}|$ values are compared against $TA'_m$ and $TB'_m$. The new two minimum values are stored in $TA'_m$ (minimum) and $TB'_m$ (second minimum) in T-Reg 535. The index of the minimum Q value ($P_m$) and sign bits for all Q values are also updated in T-Reg 535. After the final comparison, the $TA'_m$ and $TB'_m$ are written to T-Reg as $TA_m$, $TB_m$. An additive or multiplicative factor can be applied to $TA_m$ and $TB_m$ for scaled-Min-Sum or Offset-Min-Sum implementation. After the first scan, the content of T-Reg is written to R-Mem 560.

Second Scan (Update LLR) 440

After the second scan 440, the LLR values are updated. For each column n, there are W=2 rows (m1 and m2) have '1' in the current block row. The check-to-bit extrinsic information is updated such that $$|R'_{m1,n}| = \begin{cases} TA_{m1} & \text{if } n = P_{m1} \\ TB_{m1} & \text{otherwise} \end{cases}$$

$$\text{sgn}(R'_{m1,n}) = \prod (\text{sgn}(Q_{m1,n'}) \mid H(m1, n') = 1 \text{ and } n' \neq n)$$

$$|R'_{m2,n}| = \begin{cases} TA_{m2} & \text{if } n = P_{m2} \\ TB_{m2} & \text{otherwise} \end{cases}$$

$$\text{sgn}(R'_{m2,n}) = \prod (\text{sgn}(Q_{m2,n'}) \mid H(m2, n') = 1 \text{ and } n' \neq n)$$

R Gen 565 gets R values from R-Mem 560. R' Gen 575 gets values from T-Reg 570 and generates R' values. The LLR value is updated as $$L'_n = L_n + (R'_{m1,n} - R_{m1,n}) + (R'_{m2,n} - R_{m2,n})$$

The iterative process will be performed for all M block rows and for multiple of iterations.

Output:

If the specific stopping criteria are met, for example, the decoder reach maximum iterations or all parity check equations met, the soft-information or hard-decision of updated $L_n$ are output from LLR-Mem 510.

The decoder cycle-by-cycle operation for the decoder is depicted in FIG. 9.

The coded data rate of the decoder for the current setting can be formulated as following:

$$T = \frac{N \times Z \times F_{clk}}{Iter \times M \times 2 \times (N+1) \times \lceil W/2 \rceil}$$

While the invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein. Other items shown or discussed as directly coupled or communicating with each other may be coupled through some interface or device, such that the items may no longer be considered directly coupled to each other but may still be indirectly coupled and in communication, whether electrically, mechanically, or otherwise with one another. Other examples of changes, substitutions, and alterations will become apparent to those skilled in the art. It is intended that the following claims be interpreted to embrace all such changes, substitutions, and alterations.

What is claimed is:

1. A method of layer message updating, said method comprising:
    initializing a belief information of each bit (corresponding to a column in H matrix) with a log-likelihood-ratio LLR value;
    initializing extrinsic information from a check node m (corresponding to a row in H matrix) to a bit n to 0;
    performing iteration in a block row order, for each row m in a block row M, a plurality of sub-matrixes in said block row are scanned through twice, wherein each non-zero sub-matrix will have W positions with a '1' in the H matrix;
    before a first scan;
        initializing two variables for a first minimum and a second minimum to maximum possible positive value;
        for each non-zero submatrix in a plurality of N sub-matrixes in said block row m, a plurality of W bits (n1, nw, . . . nW) are obtained;
        calculating said extrinsic information from bit n1, nw, . . . nW to check m;
        comparing a plurality of values $|Q_{m,n1}|$, $|Q_{m,nw}|$, . . . $|Q_{m,nW}|$ against said first minimum and said second minimum to find a new first minimum value and a new second minimum value;
        storing said new minimum values;
        recording an index of a minimum Q value ($P_m$) and sign bits for all Q values;
    after a second scan;
        said LLR values are updated, for each column n, there are W rows (m1.mw, . . . , mW) having '1' in the current block row;
        updating said extrinsic information;
        updating said LLR value; and
        outputting said LLR value when specific stopping criteria are met.

2. The method of claim 1, the iterative process is to be performed for all M block rows and for multiple of iterations.

3. The method of claim 1, wherein the minimum values may be a plurality of minimum values greater than two.

4. The method of claim 1, wherein W=1.

5. The method of claim 1, wherein W>1.

6. A double scan decoding method of a matrix wherein each of a plurality of sub-matrixes has W positions, said method comprising:
    initializing a belief information with intrinsic information;
    performing iteration of a matrix in a block row order, comprising:
        a first scan for finding a first minimum and a second minimum;
        a second scan for updating extrinsic information, said second scan comprising:
            reading belief information $L_n$ from a first memory;
            generating new extrinsic information $R'_{m,n1}$, $R'_{m,nw}$, . . . $R'_{m,nW}$ from a second memory;
            generating extrinsic information $R_{m,n1}$, $R_{m,nw}$, . . . $R_{m,nW}$ from a third memory;
            computing a delta $R_{m,nw}$ by subtracting $R_{m,nw}$ from $R'_{m,nw}$ where w=1 to W;
            permuting delta $R_{m,nw}$ to delta $R_{mw,n}$ where w=1 to W;
            computing a new belief information $L'_n$ wherein $L'_n = L_n + \text{delta\_}R_{m1,n} + \text{delta\_}R_{mw,n} + \ldots + \text{delta\_}R_{mW,n}$; and
            storing said new belief information $L'_n$; and
            outputting belief information.

7. The method of claim 6, wherein outputting belief information in the form of soft information.

8. The method of claim 6, wherein outputting belief information in the form of a hard decision.

9. The method of claim 6, further comprising: recording an index of minimum Q value and sign bits for all Q values.

10. The method of claim 6, wherein W=1.

11. The method of claim 6, wherein W>1.

* * * * *